United States Patent [19]

Cunningham et al.

[11] 4,335,162
[45] Jun. 15, 1982

[54] METHOD OF PRODUCING A FAULT TRANSPARENT BUBBLE MEMORY BY DIFFUSING MANGANESE IN PRESELECTED PERMALLOY ELEMENTS

[75] Inventors: James A. Cunningham, Saratoga; Anthony M. Tuxford, San Francisco, both of Calif.

[73] Assignee: National Semiconductor Corporation, Santa Clara, Calif.

[21] Appl. No.: 143,624

[22] Filed: Apr. 25, 1980

[51] Int. Cl.$^3$ .................. G11C 19/08; B05D 5/12
[52] U.S. Cl. ............................ 427/130; 365/15; 365/39
[58] Field of Search ............ 365/15, 39; 427/130, 427/131, 132

[56] References Cited

U.S. PATENT DOCUMENTS 4,233,670 11/1980 Reyling, Jr. .................. 365/39

OTHER PUBLICATIONS

IEEE Transactions on Magnetics—vol. Mag-15, No. 6, Nov. 1979, pp. 1648-1650.

Journal of Applied Physics—vol. 38, No. 3, Mar. 1, 1967, pp. 1431-1433.

Primary Examiner—James W. Moffitt
Attorney, Agent, or Firm—Gail W. Woodward; James A. Sheridan; Neil B. Schulte

[57] ABSTRACT

A bubble memory includes a garnet film and a pattern of overlying propagation elements, each made of a layer of permalloy and a layer of manganese. The elements define a plurality of paths for propagating magnetic bubble domains under the influence of a Z bias magnetic field and a rotating XY magnetic drive field. The configuration and positioning of the propagation elements is such that the magnetic bubble domains can be selectively routed, e.g. to bypass defective minor loops, by creating barriers over which the magnetic bubble domains will not propagate. Preselected ones of the elements are preferably heated with a laser beam to a temperature which is approximately 75-90% of the melting point of the permalloy. This diffuses the manganese in the permalloy sufficiently to quench the magnetization in the permalloy to thereby create the barriers to bubble propagation.

1 Claim, 13 Drawing Figures

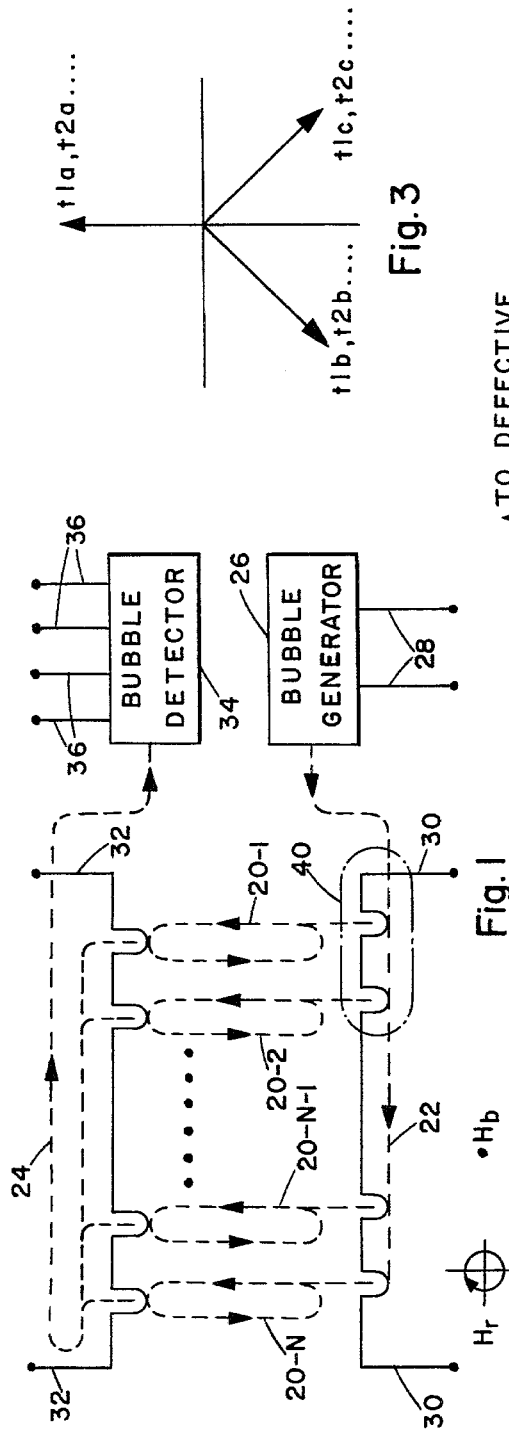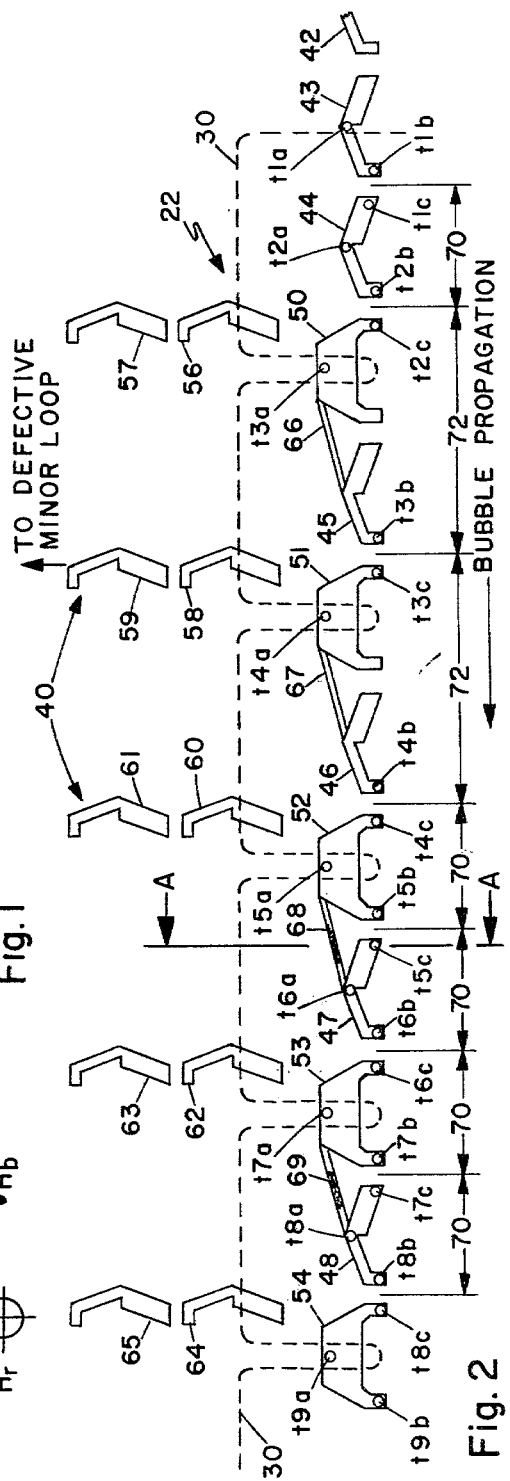

METHOD OF PRODUCING A FAULT TRANSPARENT BUBBLE MEMORY BY DIFFUSING MANGANESE IN PRESELECTED PERMALLOY ELEMENTS

BACKGROUND OF THE INVENTION

The present invention relates to magnetic bubble memories, and more particularly to methods for routing of data to and from only non-defective minor loops in bubble memories employing redundant minor loops.

Currently, the most popular architecture for magnetic bubble memories is that in which magnetic bubbles are stored in a plurality of parallel minor loops. In a block replicate bubble memory a serial-parallel bubble propagation path is used to transfer bubbles into parallel minor loops, and a parallel-serial bubble propagation path is used to transfer bubbles from the minor loops.

However, due to a variety of causes, some of the minor loops develop defects during their fabrication. For example, the defects may be due to flaws in the garnet film, which resist bubble propagation. They may also be due to permalloy shorts attributable to photolithographic tolerances, or due to dust and other impurities which enter the memory during its fabrication. As a result, some small percentage of the minor loops, such as five percent or less, typically do not work.

To overcome this problem bubble memories are fabricated with extra or so-called redundant minor loops. Then all defective loops, and any good loops in excess of a design number simply are not used during the write and read operations. Suppose for example, that a bubble memory chip was designed to have 256 fault free minor loops. To achieve this the memory would be built with some larger number of minor loops, such as 270. Then in most cases, at least 256 loops would be fault free.

The problem then becomes one of devising a method for bypassing the defective loops as information is written into and read from the memory. Suppose that in the preceding example, loops ten and one hundred were defective. Under those conditions, no data could be written into the memory on the tenth and one hundredth clocking pulses out of every 270 clocking pulses. Similarly, during a reading operation, the tenth and one hundredth information bits out of every 270 bits of information that are read from the memory must be ignored.

In the past such control functions have been performed with the aid of external control circuitry. One common prior art control circuitry includes a read only memory (ROM) that is programmed to indicate which of the loops are defective. Address counters simultaneously address both the ROM and the bubble memory. When the ROM output indicates that the bubble memory location being addressed is defective, corrective action is taken. For a discussion of the ROM approach to mask out defective minor loops see the book entitled *Magnetic-Bubble Memory Technology* written by Hsu Chang, pages 35-36, copyright 1978, and published by Marcel Dekker, Inc.

More recently, some bubble memories have included a single extra loop on the chip for storing error map information therein. The user is thus able to read the error map from the memory during system initialization and the error map is thereafter stored in a random access memory (RAM). The RAM is then used in conjunction with control logic to mask out the defective loops during a write or read operation. Published German patent application No. 2804695 filed by Texas Instruments, Inc. is believed to be illustrative of this last mentioned approach.

Both of the above approaches, however, have certain deficiencies. For example, with the ROM approach, each memory system requires unique parts. That is, the ROM for one memory system cannot be used as the ROM in another memory system because the bubble memory chips in each memory system have different defective minor loops. Furthermore, when a bubble chip in a memory system goes completely bad, due to aging for example, the replacement of the bubble chip also neccessitates the replacement of the ROM.

One problem with the prior are bubble memory chips that provide an on chip error map loop is that they include no redundant error map loops. That is, they include only a single error map loop. If that loop is defective, then the entire chip must be discarded. Thus, the production yield of those bubble memories chips is undesirably low. Furthermore, there is a risk when storing the error map in an extra minor loop that the starting and stopping of the drive field will not be precise with regard to 360° of orientation. Because of this, it is possible for magnetic bubbles of the error map to jump between adjacent permalloy propagation elements when they are not supposed to. This so-called data scrambling results in the loss of the error map.

U.S. Pat. No. 4,228,522 assigned to the assignee of the present application, discloses a bubble memory that includes a plurality of minor loops for storing bubbles representative of data therein, and a pair of minor loops for storing bubbles representative of an error map therein. Proper choice of the number of propagation elements enables the error map to be selectively written into and read from only one loop of the pair of error map loops with only a single control line. This design produces the high chip yield.

Other patents of interest which deal with the problem of masking out defective minor loops in a magnetic bubble memory are U.S. Pat. Nos. 3,909,810; 4,073,012; and 4,090,251.

One problem with the error map approach to handling defective minor loops is that the added control circuitry increases the cost of the bubble memory system. Furthermore, it increases the complexity of the chip design. Also, frequently the bubble memory chips are not interchangeable. In addition, the operating speed of a bubble memory incorporating the error map approach is slower than it would be if the defects were transparent to the user. Consider again the above described example that had 270 total loops of which only 256 were guaranteed to be non-defective. In that memory, a total of 270 revolutions of an external magnetic drive field are required to load one bubble into each of 256 minor loops.

Conversely, if the defective loops were transparent to the user, a total of only 256 rotations of the magnetic field would be required to load one bubble into each of the loops.

In U.S. Pat. No. 4,233,670, assigned to the assignee of the present application, there is described a fault transparent magnetic bubble memory in which magnetic bubbles are routed away from defective minor loops by selectively destroying certain permalloy shorting bars to convert double-distance bubble propagation elements to single-distance bubble propagation elements. This is done in both the serial-parallel input and parallel-serial output propagation paths. As a result, the number of rotations of the magnetic drive field that are required to load one bubble into each of 256 non-defective minor loops and to read one bubble from each of these loops can be reduced to 256. The defective minor loops are determined during the fabrication process and preselected ones of the permalloy elements are destroyed using a computer controlled laser beam. The need for error map storage loops, control circuitry for masking out defective minor loops pursuant to the error map, and complex permalloy patterns for handling the on chip propagation and storage of the error map, is eliminated.

Aforementioned U.S. Pat. No. 4,233,670 describes two different techniques for destroying a selected permalloy element. In one method, a laser beam of sufficient power is applied to the element for sufficient duration so that the permalloy element is vaporized and effectively severed at one point. The other method is to heat the permalloy element with the laser beam to a temperature sufficient to substantially degrade the magnetic properties of the element. This will insure that the element acts as a barrier over which magnetic bubbles will not propagate.

Both of the above-described laser beam approaches to destroying selected permalloy elements in order to mask out the defective minor loops have certain drawbacks. It is difficult to clearly and reproduceably sever a permalloy propagation element on a bubble memory chip with a laser beam. Molten material and gas which are generated upon laser beam cutting, tend to escape violently. This can result in rupturing of overlying materials and contamination of adjacent areas with debris. Frequently, the thermal conductivity of the bubble chips varies from one location to the next. A laser blast that might neatly sever a permalloy element in one area of the chip may not accomplish the same objective with regard to an element in another area of the chip. The laser beam can be automatically driven over different elements via computer control. However, it is not possible to continuously vary the intensity of the beam in accordance with the different thermal conductivities of the chip at different locations.

It would be desirable to develop an improved method of heating preselected permalloy propagation elements on a bubble memory chip which would insure a uniform degradation of their magnetic properties so that they would each present barriers to bubble propagation. Such an improved method would preferrably utilize a computer driven laser beam which can be accurately applied to individual microelectronic permalloy elements. Such an improved method would have to permit a wider range of temperatures than the methods of Reyling described above. In one of the Reyling methods the permalloy elements are heated to a critical temperature below the melting point of the permalloy in order to degrade their magnetic properties to a sufficient degree. It would further be desirable that this improved method effectively destroy the magnetic properties of the permalloy elements to the same degree that would result from physical severing, but without the violent effects associated with physical severing by laser beam.

An example of the process which might accomplish the desired local loss of magnetization is oxidation. This method requires, as a source of oxygen, an insulating layer in contact with the permalloy which is less thermodynamically stable than the oxides of NiFe. The commonly used insulating layers of materials such as $Al_2O_3$ and $SiO_2$ are not satisfactory. Thermodynamically, the bond strengths of NiFe with oxygen are relatively weak and thus this approach would be structurally unsound. Furthermore, it is believed that the search for a suitable insulating layer material for this application would probably be futile.

Another approach would be to select a material which, upon diffusion into the permalloy elements, would tend to destroy their magnetization. This material could be deposited by any conventional technique, e.g. sputtering, vacuum deposition, or plating, on either side of the permalloy layer. Diffusion into the permalloy elements would take place locally by selective laser heating. The heating would be limited so that splattering and other physical disruption would be minimized or eliminated thus increasing the process latitude. The magnetization "poison" material could be photolithographically etched at the same time that the permalloy is etched to define the individual propagation elements.

It is known that the introduction of nonferromagnetic copper into permalloy tends to quench its magnetization. However, it would not be suitable to form a copper film on either side of the permalloy propagation elements in a magnetic bubble memory because of the high electrical conductivity of copper. This conductivity would tend to place a short circuit in parallel with the permalloy elements of the bubble detector, thus degrading the detector's sensitivity. For example, a film of permalloy having a thickness of approximately 4,000 angstroms would have a resistance of about 0.5 ohms/square. If a film of copper having a thickness of approximately 200 angstroms were to be formed on the just mentioned permalloy film, it would represent a five percent addition in thickness. This copper film would have a resistance of about 0.8 ohms/square.

It has also been reported that manganese tends to quench the magnetization in permalloy. See the article entitled "Properties of Manganese-Permalloy Films" written by A. J. Griest and B. L. Flur, and published in the Journal of Applied Physics, Volume 38, No. 3, March 1, 1967 pages 1431–1433. Manganese is an excellent choice as a magnetic quenching agent for permalloy propagation elements in a magnetic bubble memory because its resistivity is very high. For example, a film of manganese having a thickness of approximately 200 angstroms has a resistance of about 70 ohms/square. Adding this film to a film of permalloy having a thickness of approximately 4,000 angstroms would change the resistance of the bubble detector by only three percent. This is an acceptably low value. Thus, manganese, in relatively low concentrations, would achieve the objective. The calculations in the above examples concerning copper and manganese films are only approximate and are set forth merely for comparison. Bulk values of resistivity were used in the calculations.

Another article of interest is entitled "Toward a Single Mask Processing of Ion-implanted Bubble Devices" by K. Y. Ahn and S. M. Kane, published in the IEEE Transactions on Magnetics, Vol. MAG-15, 1979, pages 1648–1650. It discloses a fabrication process for a bubble memory in which the permalloy layer is not etched. Instead, manganese is selectively diffused into the permalloy layer to define individual propagation elements. A laser beam is not utilized.

SUMMARY OF THE INVENTION

It is therefore a primary object of the present invention to provide an improved magnetic bubble memory.

Another object of the present invention is to provide a bubble memory having defective minor loops that can be masked out of the write and read operations without utilizing external control circuitry or an error map.

Still another object of the present invention is to provide magnetic bubble memory chips that are interchangeable.

A further object of the present invention is to provide magnetic bubble memory chips having improved data transfer time.

Yet another object of the present invention is to provide a fault transparent magnetic bubble memory having a plurality of parallel data loops and permalloy elements having an overlying layer of manganese which may be diffused into the permalloy by application of a laser in order to route data away from defective minor loops.

Another object of the present invention is to provide a method of producing fault transparent magnetic bubble memory chips utilizing a laser to diffuse magnetic quenching manganese in preselected permalloy elements to create barriers to bubble propagation that will route bubbles away from defective minor loops.

Finally, it is the object of the present invention to increase bubble memory chip yield.

The disclosed bubble memory includes a garnet film and a pattern of overlying propagation elements, each made of a layer of permalloy and a layer of manganese. The elements define a plurality of paths for propagating magnetic bubble domains under the influence of a Z bias magnetic field and a rotating XY magnetic drive field. The configuration and positioning of the propagation elements is such that the magnetic bubble domains can be selectively routed, e.g. to bypass defective minor loops, by creating barriers over which the magnetic bubble domains will not propagate. Preselected ones of the elements are preferably heated with a laser beam to a temperature which is approximately 75-90% of the melting point of the permalloy. This diffuses the manganese in the permalloy sufficiently to quench the magnetization in the permalloy to thereby create the barriers to bubble propagation.

BRIEF DESCRIPTION OF THE DRAWINGS

FIG. 1 is a schematic diagram of a block replicate magnetic bubble memory constructed according to the invention.

FIG. 2 is a greatly enlarged top plan view of a portion of the serial-parallel bubble propagation path in the memory of FIG. 1.

FIG. 3 correlates the position of a rotating magnetic drive field with the position of a magnetic bubble in FIG. 2.

Like reference numerals throughout the figures refer to like parts. The relative dimensions in the figures are not to scale.

DESCRIPTION OF THE PREFERRED EMBODIMENT

Figure 4:
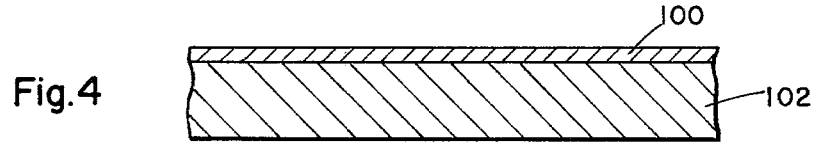
FIGS. 4-13 are a series of fragmentary vertical sectional views taken along line A—A of FIG. 2 which depict the fabrication process of the memory of FIG. 1.
Figure 5:
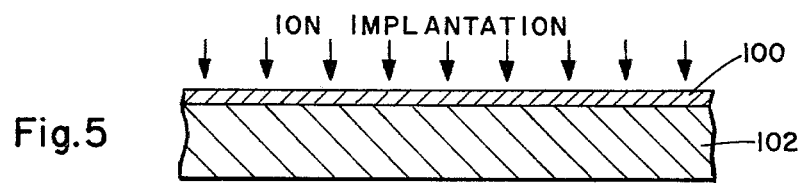
Figure 6:
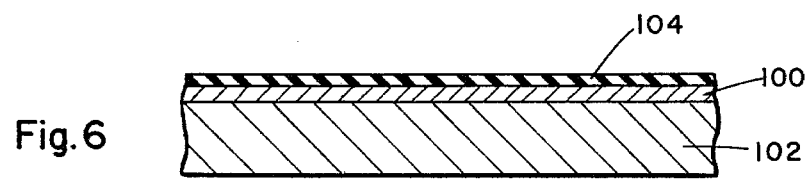
Figure 7:
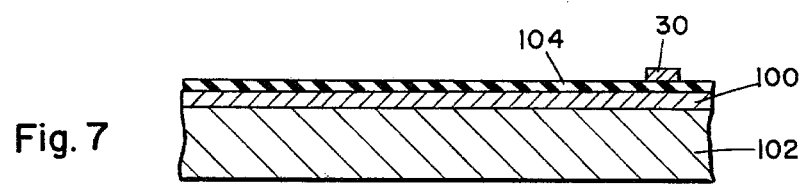
Figure 8:
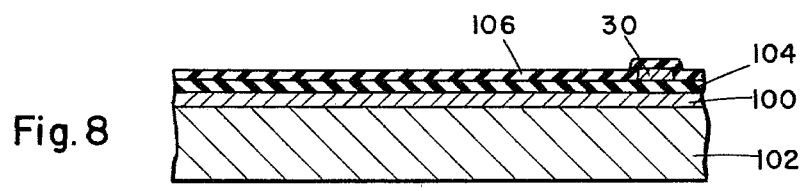
Figure 9:
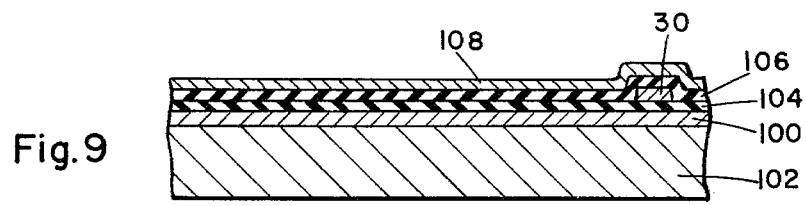
Figure 10:
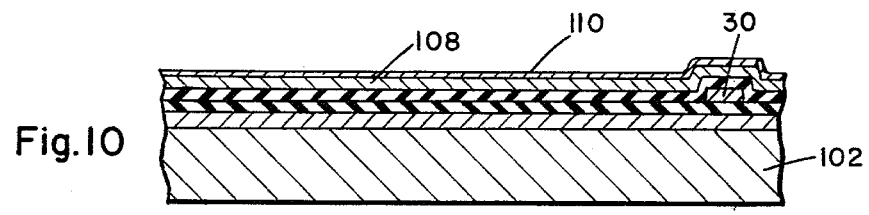
Figure 11:
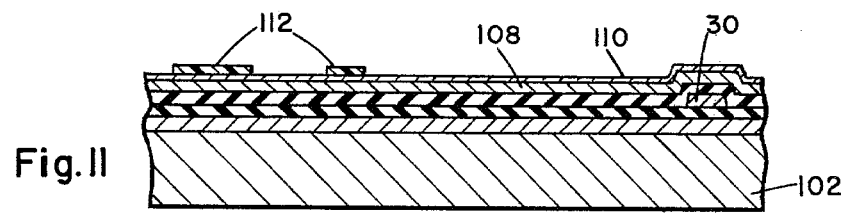

Initially, it should be emphasized that the present invention can be utilized in a wide variety of bubble memory architectures. For purposes of illustration only, the invention will be described in connection with a fault transparent block replicate bubble memory of the architecture described in co-pending U.S. patent application Ser. No. 968,172 of George F. Reyling discussed above. Initially, the overall architecture and operation of the illustrated memory will be described. Thereafter will follow a detailed description of the manner in which this memory may be fabricated according to the present invention.

As is conventional, information storage and retrieval in the magnetic bubble memory hereafter described is accomplished and measured by the presence or absence of magnetic bubble domains which are propagated and manipulated on a chip. The chip includes a plurality of spaced apart permalloy propagation elements which overlie a thin film of garnet. The maintenance and propagation of the magnetic bubble domains along the paths of the propagation elements is accomplished through the utilization of an in-plane (XY) rotating magnetic drive field $H_r$ in the presence of a Z bias magnetic field $H_b$ having its lines of force perpendicular to the plane of the film.

Referring now to FIG. 1, there is illustrated therein a block replicate bubble memory which includes a plurality of minor loops 20-1, 20-2, . . . 20-N. Magnetic bubbles are propagated in these loops in the direction indicated by the arrows in response to the rotating drive field $H_r$.

Also included in the memory of FIG. 1, is a serial-parallel input propagation path 22 and a parallel-serial output propagation path 24. Paths 22 and 24 respectively provide means for inputting bubbles into the minor loops and outputting bubbles from the minor loops.

In operation, bubbles are generated in a serial fashion on path 22 by a bubble generator 26. The generator produces the bubbles in response to the application of external signals applied to a pair of bubble generator leads 28. As is conventional in bubble memories having parallel minor loops connected to serial-parallel input and parallel-serial output propagation paths, the data stream produced by the bubble generator 26 has an idle or unused bit position between each information bit position. The use of such an idle bit position is discussed in U.S. Pat. No. 3,909,810.

The rotating magnetic drive field $H_r$ propagates the magnetic bubbles of the data stream along the serial portion of the input path 22 until the bubbles of the stream respectively align with the various inputs to the minor loops. Subsequently, in response to external signals applied to a transferin control conductor 30, the bubbles propagate along the various parallel inputs to the minor loops. Due to various processing limitations previously described, some of the minor loops 20-1 through 20-N will be defective. Accordingly, the conventional practice is to generate the data stream in pre-programmed cycles such that the information bit positions on the input path 22 will align with only the non-defective minor loops prior to pulsing the transfer-in control conductor 30. At this time, the bit positions aligned with the defective loops will contain no information.

Similarly, in response to the application of external signals to a transfer-out control conductor 32, one bubble from each of the non-defective minor loops is made to propagate through the parallel portions of the output path 24. These bubbles are subsequently merged onto the serial portion of the output path 24. Then they are serially propagated to a bubble detector 34 which operates to generate signals representative of the bubbles on output lead 36 as the bubbles are detected.

In the memory of FIG. 1, the input and output propagation paths 22 and 24 have a unique design which allows defective minor loops to be made transparent to the user. Basically, this design allows the defective minor loops to be bypassed. In this memory, it is possible to selectively route the bubbles to eliminate the defective minor loops from the write and read operations by creating barriers to bubble propagation at predetermined locations in the memory. Essentially, in the memory of FIG. 1, the bypassing of defective minor loops occurs in the following manner. The number of rotations of the magnetic drive field $H_r$ which are required to propagate a bubble between the non-defective adjacent loops is the same as the number of drive field rotations that are required to propagate a bubble between two non-defective loops which have one defective loop lying therebetween.

It should be pointed out that the routing approach hereafter described for bypassing the defective minor loops will not work where two defective minor loops are immediately adjacent to each other. However, in a bubble memory chip having a large number of loops, usually five percent or less of the minor loops will be defective. Because these defective loops are randomly distributed, the probability that two defective loops will be adjacent to each other is low. In other words, a statistically large percentage of the bubble memory chips which do have defective minor loops, will not have immediately adjacent defective minor loops. Therefore, the following routine approach allows a large percentage of the bubble memory chips to be made fault transparent. As to those bubble memory chips having immediately adjacent defective minor loops, the user may be provided with an error map so that conventional circuitry and a ROM can be utilized to mask out defective loops in a manner well known in the field.

The selection of which of the minor loops are to be bypassed is programmable, and the programming occurs near the end of the memory's fabrication process. In accordance with this design, the memory is tested near the end of its fabrication process to determine which of the minor loops are defective. Thereafter, a programming step is performed which causes all defective loops to be bypassed during operation of the memory.

FIG. 2 shows a portion 40 of the serial-parallel input path 22 of the memory of FIG. 1 in greatly enlarged form. The serial portion of the input path includes asymmetric chevron propagation elements 42–48 and C-bar propagation elements 50–54. The parallel portions of the input path 22 are made of asymmetric chevron propagation elements 56–65. The chevrons 56 and 57 lead to the minor loop 20-1, the chevrons 58 and 59 lead to the minor loop 20-2, and so forth. In FIG. 2, it is assumed that chevrons 58 and 59 lead to a defective minor loop, i.e., the minor loop 20-2 is assumed to be defective due to one of the causes previously discussed. The other ones of the chevrons 56–65 are assumed to lead to good minor loops.

In the serial portion of the input propagation path shown in FIG. 2, shorting bars 66–69 connect adjacent ones of the chevrons and C-bars as indicated. Both the chevrons and the C-bars are single distance propagation elements. That is, with the shorting bars removed, one rotation of the magnetic drive field $H_r$ causes bubbles to propagate along these elements by a predetermined single distance. This distance is indicated in FIG. 2 with reference numeral 70.

In FIG. 2, one pair of the single distance propagation elements lie between each of the parallel inputs to the minor loops. Associated with each of these pairs of single distance propagation elements are the respective shorting bars 66–69. The combination of a pair of single distance propagation elements with one shorting element which has not been thermally treated as hereafter described is referred as a double-distance propagation element. These double distance propagation elements operate to propagate a bubble twice as far as a single-distance propagation element in one rotation of the magnetic drive field $H_r$. In FIG. 2, reference numeral 72 indicates the distance that a bubble travels on a double-distance propagation element in response to one rotation of the drive field.

In accordance with the present invention, the shorting bars are constructed such that they can be heated to quench their magnetization to thereby create barriers to bubble propagation. In FIG. 2, the shorting bars 68 and 69 have been so heated as indicated by the shading. Thus the propagation elements 52, 47, 53 and 48 form four single-distance propagation elements instead of two single-distance propagation elements.

Next, consider how the serial-parallel input propagation path 22 of FIG. 2 operates after the above described selective treatment of the shorting elements has occurred. FIG. 3 shows the position of the rotating magnetic drive field $H_r$ at various time instances $t1a$, $t1b$, $t1c$, $t2a$, $t2b$, and so on. Time instances $t1a$, $t1b$, and $t1c$ occur in one rotation of the drive field; time instances $t2a$, $t2b$, and $t2c$ occur in another rotation of the drive field and so on.

Referring back to path 22 of FIG. 2, the propagation of a single magnetic bubble domain in the direction indicated by the arrow is illustrated by a small circle. The various circles are labeled with designations $t1a$, $t1b$, etc., to indicate the position of the bubble during the various time instances of the rotation of the magnetic field depicted graphically in FIG. 3. Inspection of FIG. 2 shows that one complete revolution of the magnetic drive field moves the bubble between corresponding positions on successive propagation elements. In addition, further inspection of FIG. 2 shows that only three complete rotations of the magnetic drive field are required to move the bubble from a position on the propagation element 44 to a corresponding position on the propagation element 52. This is because two double-distance propagation elements lie therebetween. As a result, the defective minor loop is bypassed.

For comparison, assume that the shorting element 66 had been thermally treated, to produce a barrier to bubble propagation. Then three rotations of the magnetic drive field would have caused the bubble on the propagation element 44 to only propagate to the element 51 directly beneath the defective loop. This is because two single-distance propagation elements would have lay therebetween. A similar movement of the bubble occurs over the single-distance propagation elements 52, 47, 53, 48 and 54.

It should be emphasized that FIG. 2 depicts the movement of a single bubble during successive rotations of the drive field $H_r$. It does not represent the propagation of a data stream down the serial portion of the path.

In actual operation, the data stream consists of an alternating sequence of information bit positions and idle bit positions.

During the fabrication process, the defective loops are determined and then selected ones of the shorting bars are thermally treated. Specifically, defective loops are bypassed by changing each of the double-distance propagation elements that lie between fault free minor loops into a pair of single-distance propagation elements. A predetermined number of revolutions of the drive field are required to bring the data stream into alignment beneath the set of minor loops. Thereafter, when the transfer-in control signals are applied to the conductor 30, the bubbles from information bit positions will be transferred into good loops and only idle bit positions will lie beneath defective loops. The parallel-serial output propagation path 24 is similarly constructed and works in an analogous manner.

FIGS. 4–13 are a series of fragmentary vertical sectional views taken along line A—A of FIG. 2. They illustrate the steps by which the bubble memory just described may be fabricated. The section line A—A has been chosen to illustrate the construction of propagation element 47, the thermally treated propagation element 68, and the control conductor 30. It will be understood that in accordance with conventional techniques, all of the elements are simultaneously formed during a sequence of processing steps.

The propagation elements are configured and positioned so that the magnetic bubble domains can be selectively routed by heating preselected ones of the elements to a predetermined temperature at one stage of the fabrication process. This creates barriers over which the magnetic bubble domains will not propagate during the operation of the memory. In order to accomplish this, the elements are each made of a layer of permalloy and a layer of manganese. By heating preselected ones of the elements to a predetermined temperature, the manganese can be diffused into the permalloy sufficiently to quench the magnetization in the permalloy to thereby create barriers to bubble propagation. Other than the foregoing, the fabrication process may utilize conventional process steps and materials.

The fabrication of a bubble memory begins with the epitaxial growth of a magnetic garnet layer 100 (FIG. 4) on top of a substrate 102 made of a suitable material such as gadolinium gallium garnet. Thereafter, an ion implantation step (FIG. 5) is used to suppress "hard" bubbles. Next, a first insulating layer 104 (FIG. 6) is deposited over the garnet layer 100 by any conventional technique such as vacuum deposition, sputtering, or RF plasma deposition. This first insulating layer may be made of silicon dioxide and may have a thickness of 1,000 to 5,000 angstroms.

Next, a layer of Al-Cu (not shown) is deposited on top of the first insulating layer. This layer may have a thickness of approximately 4,000 angstroms to approximately 5,000 angstroms and may be deposited at approximately 200° C. Thereafter, the Al-Cu layer is ion-milled to form a pattern of control conductors having tapered edges, such as the control conductor 30 shown in FIG. 7. The pattern of control conductors extends over a considerable area of the chip and these conductors are used to control bubble generation, transfer, replication, and annihilation.

Next, a second insulating layer 106 (FIG. 8) is deposited over both the pattern of control conductors and the first insulating layer 104. This second insulating layer may also be made of silicon dioxide and may have a thickness of approximately 2,000 to 10,000 angstroms.

A layer of permalloy 108 (FIG. 9) is deposited over the second insulating layer 106. The permalloy may consist of 81% Ni and 19% Fe target by weight. It may be deposited by sputtering at a temperature of approximately 350° C. The permalloy layer 108 may have a thickness of approximately 3,000 to 5,000 angstroms. Preferably, the permalloy layer has a thickness of approximately 4,000 angstroms and the process is controlled so that the tolerance is 5%. In other words, a permalloy layer thickness of approximately 3,800 angstroms to approximately 4,200 angstroms is desirable.

The next step is to form a layer of manganese 110 (FIG. 10) on top of the permalloy layer. This manganese layer may be deposited by any conventional technique such as vacuum deposition, sputtering, or plating. After masking and etching steps hereafter described, each of the propagation elements of the bubble memory chip will consist of a layer of permalloy and an overlying layer of manganese adhered thereto.

The manganese layer must be thin enough with respect to the thickness of the permalloy layer so that it does not interfere with the magnetic properties of the permalloy required for optimum bubble propagation. However the manganese layer must be thick enough so that it can be thermally diffused into the permalloy in adequate quantities in order to sufficiently quench the magnetization in the permalloy to thereby create a barrier to bubble propagation.

The relative thicknesses of the permalloy and manganese layers in each of the propagation elements may be such that the aforementioned diffusion will occur when the element is heated to approximately 75–90% of the melting point of the permalloy. In this manner, the magnetization of selected ones of the elements can be sufficiently degraded without making the permalloy molten. This is desirable since the scattering of debri, and the rupturing of adjacent structures will be significantly reduced when the permalloy is not made molten. The manganese can be readily diffused into the NiFe (permalloy) at a relatively low temperature of 350° C.

Diffusion quenching of the magnetization is desirable since it can be achieved by heating selected ones of the elements to temperatures within a relatively wide range. This widened range thus compensates for the variations in thermal conductivity across the chip which prevents the heating of different elements to uniform target temperatures. The manganese layer 110 (FIG. 10) may be approximately 100 angstroms to approximately 300 angstroms thick. Preferably, the permalloy layer 108 is 4,000 angstroms thick and the manganese layer 110 is approximately 200 angstroms thick. Allowing for a 5% tolerance in the thickness of the manganese layer, a manganese layer thickness of approximately 190 angstroms to approximately 210 angstroms is desirable.

Figure 12:
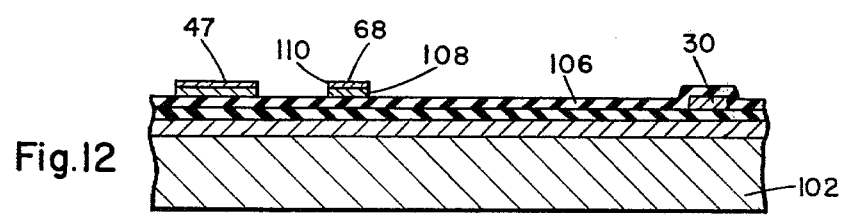

The propagation elements must be configured and positioned so that the magnetic bubbles can be selectively routed by creating barriers over which the magnetic domains will not propagate. This will enable the memory to be made fault transparent. Using standard photolithographic techniques, a patterned mask 112 (FIG. 11) made of a suitable photoresist is formed. It may be several thousand angstroms thick and it is formed on top of the manganese layer 110. Thereafter, the uncovered regions of the permalloy and manganese layers 108 and 110 are etched away and the photoresist is removed (FIG. 12) to form the individual propagation elements. Shown in FIG. 12 are vertical sectional views through the chevron 47 and the shorting bar 68 of FIG. 2.

Figure 13:
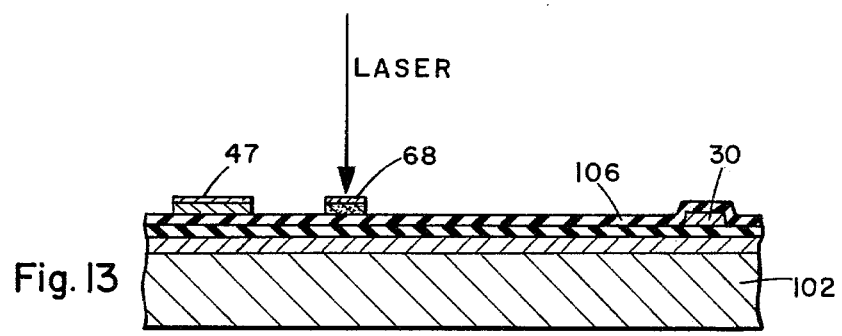

The chip is now tested to determine which of the minor loops are defective. Subsequently, a programming step is performed which causes all of the defective loops to be bypassed. Specifically, as previously indicated, the defective minor loops are bypassed by not thermally treating the shorting bars on either side thereof. As illustrated in FIG. 13, a laser beam is applied to preselected ones of the propagation elements. In this specific case, the laser beam is applied to the shorting bar 68. Applying the laser beam to preselected elements causes them to be heated to a predetermined temperature necessary to diffuse the manganese in the permalloy.

As previously indicated, preferably the preselected elements are heated to a temperature of approximately 75-90% of the melting point of the permalloy. The power level and the application time duration of the laser beam may be chosen by experimentation to achieve this result. Preferably, this thermal treating of selected ones of the propagation elements is accomplished with a computer-driven laser. One suitable laser is a pulsed Xenon laser having a diameter of approximately 5 microns, a wave-length of 5,400 angstroms and a power level of approximately 180 watts. The duration of beam application will typically be less than 300 nanoseconds. Alternatively, a YAG laser such as the QUANTRAD 1080, manufactured by QUANTRAD Corporation of El Segundo, Calif., may be used.

Having described preferred embodiments of the present invention, it should be apparent to those skilled in the art that the invention permits of modification in both arrangement and detail. Except with regard to the permalloy and the manganese thicknesses and the laser treatment, the other materials and thicknesses in the chip may be varied and any suitable fabrication processes may be utilized. The manganese could be applied to both sides of the permalloy. Furthermore, the invention is not limited to the bubble memory architecture or the propagation element configurations show. It should be understood that the invention is applicable to any magnetic bubble memory architecture and design where it is desired to route the magnetic bubbles in order to make the memory fault transparent. While the heating of the propagation elements, as described herein, is accomplished with the aid of a laser beam, conceivably other forms of energy beams could be utilized. Therefore, the invention should be limited only in accordance with the scope of the following claims.

Having described my invention, I claim:

1. A method of fabricating a magnetic bubble memory comprising the steps of:

forming a layer of garnet;

depositing a first insulating layer over the garnet layer;

forming a pattern of control conductors over the first insulating layer;

depositing a second insulating layer over the pattern of control conductors and over the first insulating layer;

forming a pattern of elements, each made of a layer of permalloy and a layer of manganese, over the second insulating layer to define a plurality of paths for propagating magnetic bubble domains under the influence of a Z bias magnetic field and a rotating XY magnetic drive field, the elements being configured and positioned so that the magnetic bubble domains can be selectively routed by creating barriers over which the magnetic domains will not propagate; and heating preselected ones of the elements to a predetermined temperature to diffuse the manganese in the permalloy sufficiently to quench the magnetization in the permalloy to thereby create the barriers, the relative thicknesses of the permalloy and manganese layers in each of the elements being such that the predetermined temperature is approximately 75% to 90% of the melting point of the permalloy.

\* \* \* \* \*